United States Patent
Yang (10) Patent No.: US 11,569,802 B1
(45) Date of Patent: Jan. 31, 2023

(54) TEMPERATURE DELAY DEVICE AND TEMPERATURE CONTROL SYSTEM

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/448,527

(22) Filed: Sep. 23, 2021

(51) Int. Cl.
| | |
|---|---|
| H03K 3/00 | (2006.01) |
| H03K 5/01 | (2006.01) |
| H03K 3/037 | (2006.01) |
| G01K 3/08 | (2006.01) |
| H03K 19/20 | (2006.01) |
| H03K 5/00 | (2006.01) |

(52) U.S. Cl.
CPC ............ *H03K 5/01* (2013.01); *G01K 3/08* (2013.01); *H03K 3/037* (2013.01); *H03K 19/20* (2013.01); *H03K 2005/00019* (2013.01)

(58) Field of Classification Search
CPC .......... H03K 5/01; H03K 3/037; H03K 19/20; H03K 2005/00019; G01K 3/08
USPC ........................................................ 327/199
See application file for complete search history.

(56) References Cited

U.S. PATENT DOCUMENTS

| | | | | |
|---|---|---|---|---|
| 7,279,948 B2* | 10/2007 | Kozawa | ............... | H03K 3/3565 327/205 |
| 7,872,491 B2* | 1/2011 | Tadamori | ............. | H03K 5/1252 327/210 |
| 9,552,447 B2* | 1/2017 | Bickford | ............. | G06F 30/3312 |
| 10,581,411 B2* | 3/2020 | Tanaka | ..................... | H03K 4/08 |
| 2006/0077742 A1* | 4/2006 | Shim | ................. | G11C 11/40615 365/222 |
| 2006/0158236 A1* | 7/2006 | Kozawa | ............... | H03K 3/3565 327/205 |
| 2011/0109372 A1* | 5/2011 | Zanardi | .................... | G01K 3/10 327/512 |
| 2012/0160824 A1* | 6/2012 | Xie | ..................... | G05D 23/1909 219/510 |
| 2014/0086746 A1* | 3/2014 | Tian | ...................... | F04D 27/004 416/35 |
| 2015/0030051 A1* | 1/2015 | Cortigiani | ................ | H02H 6/00 374/137 |

* cited by examiner

*Primary Examiner* — Ryan Jager
(74) *Attorney, Agent, or Firm* — CKC & Partners Co., LLC (57) ABSTRACT

A temperature delay device includes a first thermal sensor, a second thermal sensor, an inverter, and a latch circuit. The first thermal sensor is configured to measure a first temperature of a chip to output a first input signal. The second thermal sensor is configured to measure a second temperature of the chip to output a second input signal. The inverter is coupled to the first thermal sensor, and is configured to reverse the first input signal so as to output a third input signal. The latch circuit is coupled to the inverter and the second thermal sensor, and is configured to output an output signal according to the second input signal and the third input signal. The first temperature is different from the second temperature.

15 Claims, 8 Drawing Sheets

TEMPERATURE DELAY DEVICE AND TEMPERATURE CONTROL SYSTEM

BACKGROUND

Field of Invention

The present disclosure relates to an electric system. More particularly, the present disclosure relates to a temperature delay device and a temperature control system.

Description of Related Art

In conventional devices, a temperature generated by the operation of the chips causes the communication between chips and a control circuit to be chaotic. Due to drastic temperature changes, chips are easy to shut down so as to cause a device shut down.

For the foregoing reason, there is a need to provide some other electric circuits to solve the problems of the prior art.

SUMMARY

One aspect of the present disclosure provides a temperature delay device. The temperature delay device includes a first thermal sensor, a second thermal sensor, an inverter, and a latch circuit. The first thermal sensor is configured to measure a first temperature of a chip to output a first input signal. The second thermal sensor is configured to measure a second temperature of the chip to output a second input signal. The inverter is coupled to the first thermal sensor, and is configured to reverse the first input signal so as to output a third input signal. The latch circuit is coupled to the inverter and the second thermal sensor, and is configured to output an output signal according to the second input signal and the third input signal. The first temperature is different from the second temperature.

Another aspect of the present disclosure provides a temperature control system. The temperature control system includes a first temperature delay device, a second temperature delay device, a third temperature delay device, and a control circuit. The first temperature delay device is configured to measure a first temperature and a second temperature of a chip so as to output a first input signal. The second temperature delay device is configured to measure a third temperature and a fourth temperature of a chip so as to output a second input signal. The third temperature delay device is configured to measure a fifth temperature and a sixth temperature of a chip so as to output a third input signal. The control circuit is coupled to the first temperature delay device, the second temperature delay device, and the third temperature delay device. The control circuit is configured to receive the first input signal, the second input signal, and the third input signal so as to output two signals. Each of the first temperature, the second temperature, the third temperature, the fourth temperature, the fifth temperature, and the sixth temperature is different.

These and other aspects of the present disclosure will become apparent from the following description of the preferred embodiment taken in conjunction with the following drawings, although variations and modifications therein may be effected without departing from the spirit and scope of the novel concepts of the disclosure.

It is to be understood that both the foregoing general description and the following detailed description are by examples, and are intended to provide further explanation of the present disclosure as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
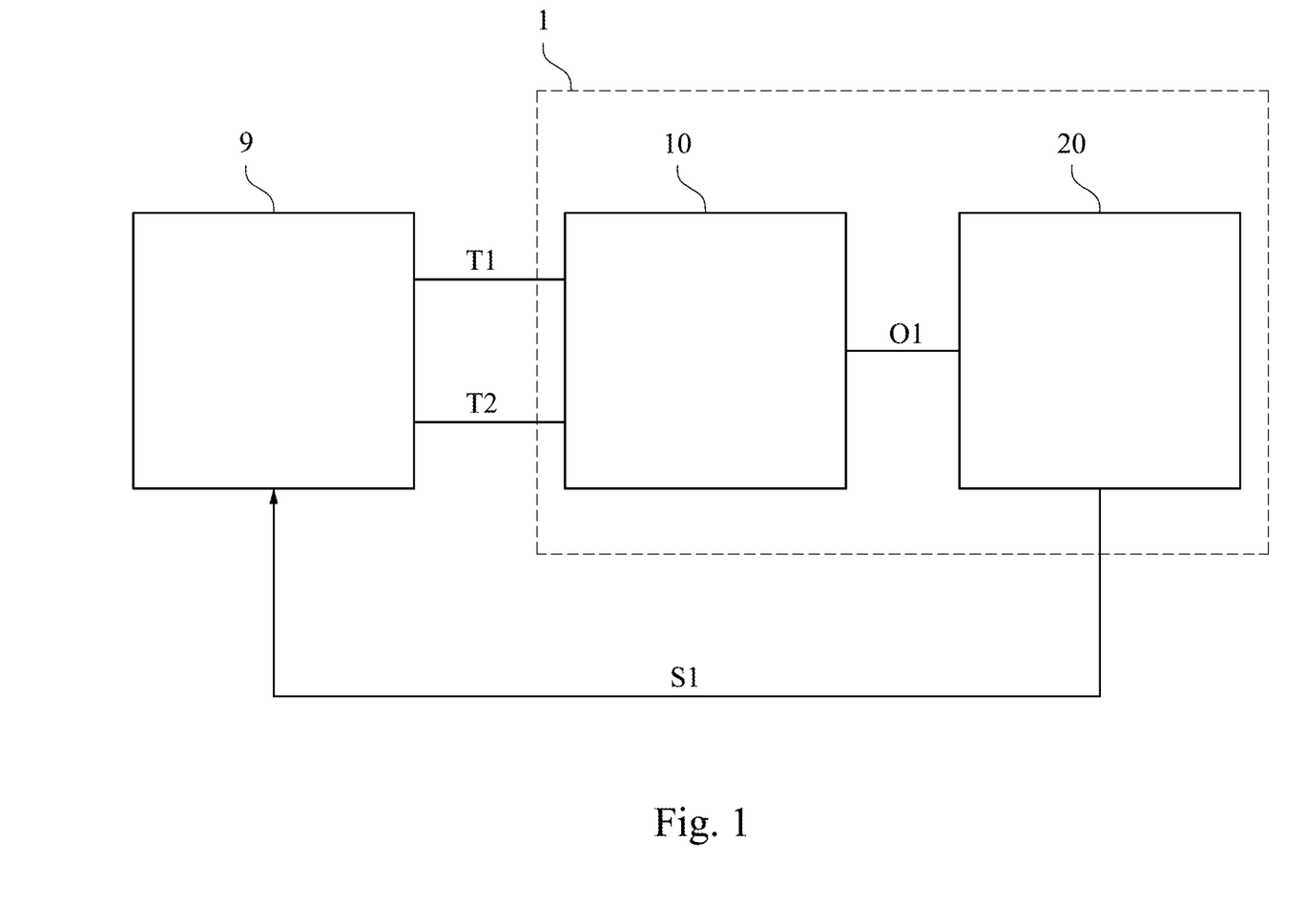
FIG. 1 depicts a schematic diagram of a temperature control system according to one embodiment of the present disclosure.

FIG. 1 depicts a schematic diagram of a temperature control system 1 according to one embodiment of the present disclosure. In some embodiments, please refer to FIG. 1, the temperature control system 1 includes a temperature delay device 10 and a control circuit 20. The control circuit 20 is coupled to the temperature delay device 10. The temperature delay device 10 is configured to measure a first temperature T1 and a second temperature T2 of a chip 9 so as to output an output signal O1 to the control circuit 20. The control circuit 20 is configured to control the chip 9 by a control signal S1 according to the output signal O1. The control circuit 20 includes a feedback circuit. The chip 9 includes one of a Flash memory, a Hard Disk Drive (HDD), a Solid State drive (SSD), a Dynamic Random Access Memory (DRAM), a Static Random Access Memory (SRAM), a Central Processing Unit (CPU), and a Graphic Processing Unit (GPU).

Figure 2:
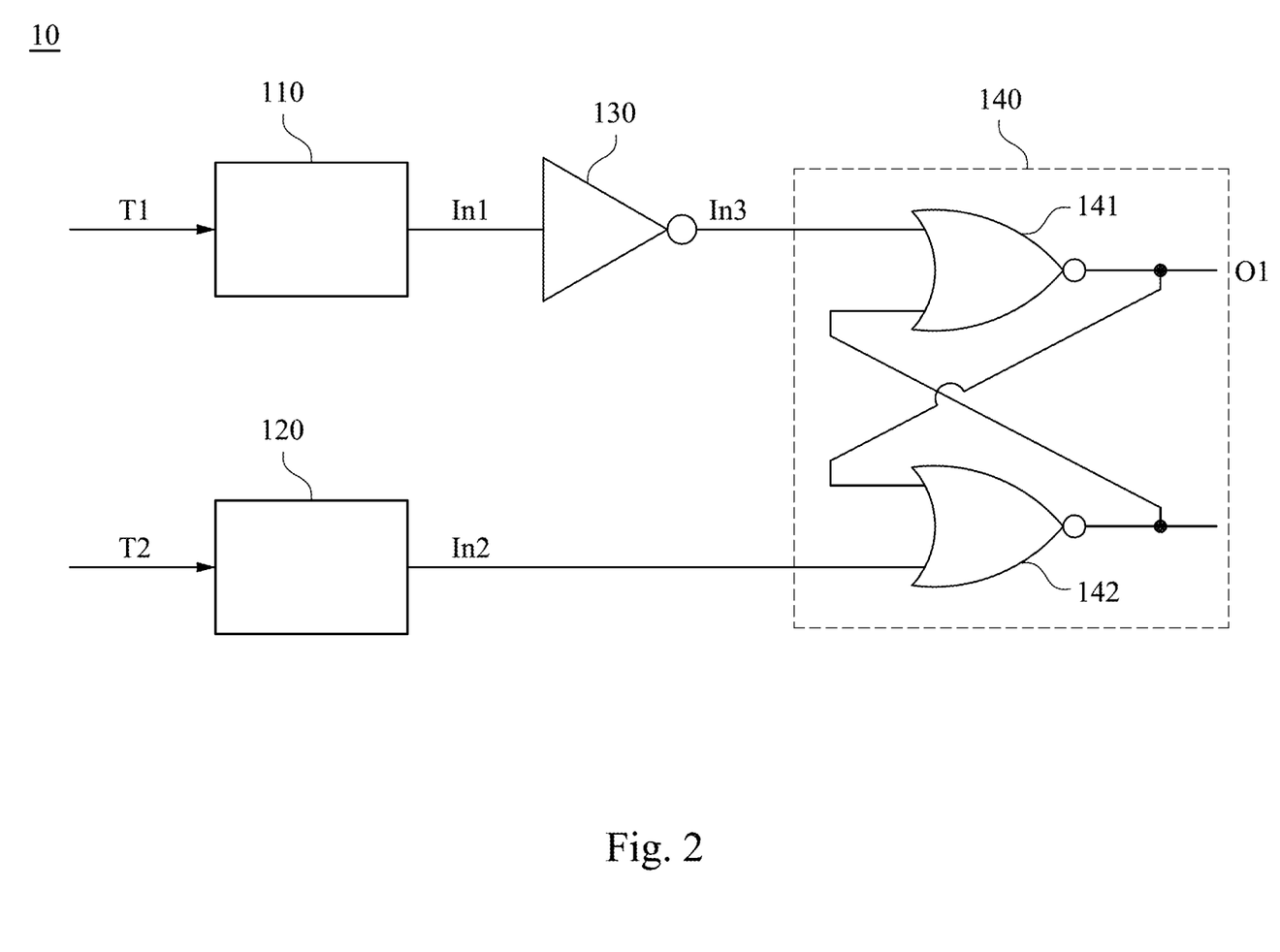
FIG. 2 depicts a schematic diagram of a temperature delay device according to one embodiment of the present disclosure.

FIG. 2 depicts a schematic diagram of a temperature delay device 10 according to one embodiment of the present disclosure. In some embodiments, please refer to FIG. 2, the temperature delay device 10 shown in FIG. 2 is a detail structure corresponding to the temperature delay device 10 in the embodiment shown in FIG. 1.

In some embodiments, please refer to FIG. 1 and FIG. 2, the temperature delay device 10 includes a first thermal sensor 110, a second thermal sensor 120, an inverter 130, and a latch circuit 140. The first thermal sensor 110 is configured to measure a first temperature T1 of the chip 9 to output a first input signal In1. The second thermal sensor 120 is configured to measure a second temperature T2 of the chip 9 to output a second input signal In2. The inverter 130 is coupled to the first thermal sensor 110, and is configured to reverse the first input signal In1 so as to output a third input signal In3. The latch circuit 140 is coupled to the inverter 130 and the second thermal sensor 120, and is configured to output an output signal O1 according to the second input signal In2 and the third input signal In3. The first temperature T1 is different from the second temperature T2.

In some embodiments, the latch circuit 140 includes a set end and a reset end. The set end of the latch circuit 140 is coupled to the inverter 130. The reset end of the latch circuit 140 is coupled to the second thermal sensor 120. The latch circuit 140 includes two logic gates (e.g. a logic gate 141 and a logic gate 142). One of the two logic gate (e.g. a logic gate 141) is coupled to the set end. Another one of the two logic gate (e.g. a logic gate 142) is coupled to the reset end. Each of the two logic gates includes one of NOR gate and NAND gate.

Figure 3:
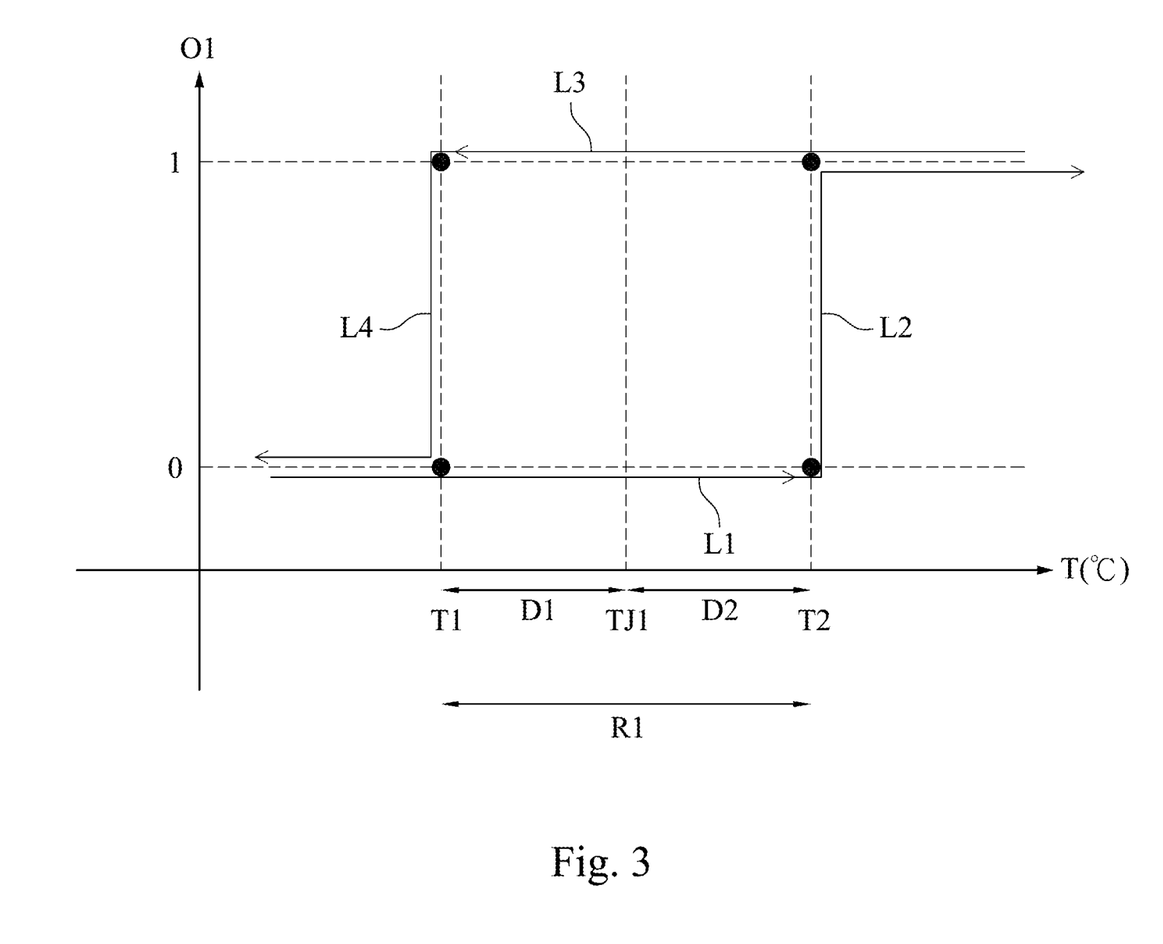
FIG. 3 depicts a coordinate graph of a relationship between a signal of a temperature delay device and a temperature of a chip according to one embodiment of the present disclosure.

FIG. 3 depicts a coordinate graph of a relationship between an output signal of a temperature delay device and a temperature of a chip according to one embodiment of the present disclosure. In some embodiments, in order to facilitate the understanding of a temperature delay device of the present disclosure, please refer FIG. 1 to FIG. 3 together, a longitudinal axis of the coordinate graph is the signal of the temperature delay device, and a horizontal axis of the coordinate graph is the temperature of the chip. A conventional temperature TJ1 is regulated by Joint Electron Tube Engineering Council (JEDEC) memory standards. A purpose of the present disclosure is to construct a temperature delay range (e.g. a temperature delay range R1) so that the chip will not shut down due to drastic temperature changes by the temperature delay device. In some embodiments, a difference D1 is between the conventional temperature TJ1 and the first temperature T1, and a difference D2 is between the conventional temperature TJ1 and the second temperature T2. In some embodiments, the difference D1 is the same as or different from the difference D2. The difference D1 and the difference D2 can be designed according to actual needs. In some embodiments, the conventional temperature TJ1 includes one of a temperature 45° C., a temperature 85° C., and a temperature 105° C.

In some embodiments, please refer FIG. 1 to FIG. 3 together, when a measured temperature of the chip 9 is higher than the first temperature T1 but less than the second temperature T2, the latch circuit 140 locks a first state of the chip 9 along a route L1. It is noted that measured temperature is an actual and changed temperature of the chip 9. Each of the first temperature T1 and the second temperature T2 is a fixed temperature in order to classify an actual temperature of the chip 9.

In detail, the first temperature T1 is measured by the first thermal sensor 110 so that the first thermal sensor 110 generates the first input signal In1 (e.g. the first input signal In1 is 1). The inverter 130 reverses the first input signal In1 (e.g. the first input signal In1 is 1) so as to output the third input signal In3 (e.g. the third input signal In3 is 0). At this time, the second temperature T2 is not measured by the second thermal sensor 120 so that the second thermal sensor 120 generates the second input signal In2 (e.g. the second input signal In2 is 0). When the second input signal In2 is 0 and the third input signal In3 is 0, the latch circuit 140 is configured to output the output signal O1 which is 0. Therefore, the control circuit 20 does not control the chip 9 to change state.

In some embodiments, when the measured temperature of the chip 9 is higher than the second temperature T2, the latch circuit 140 outputs the output signal O1 (e.g. the output signal O1 is 1) so as to change the first state of the chip 9 to a second state of the chip 9 along a route L2.

In detail, the first temperature T1 is measured by the first thermal sensor 110 so that the first thermal sensor 110 generates the first input signal In1 (e.g. the first input signal In1 is 1). The inverter 130 reverses the first input signal In1 (e.g. the first input signal In1 is 1) so as to output the third input signal In3 (e.g. the third input signal In3 is 0). At this time, the second temperature T2 is measured by the second thermal sensor 120 so that the second thermal sensor 120 generates the second input signal In2 (e.g. the second input signal In2 is 1). When the second input signal In2 is 1 and the third input signal In3 is 0, the latch circuit 140 is configured to output the output signal O1 which is 1. Therefore, the control circuit 20 controls the chip 9 to change state. It is noted that even if the measured temperature of the chip 9 drops instantly but does not exceed the temperature delay range, the chip 9 will not change state. In other words, the state of the chip 9 is latched.

In some embodiments, please refer FIG. 1 to FIG. 3 together, when the measured temperature of the chip 9 is less than the second temperature T2 but higher than the first temperature T1, the latch circuit 140 locks the second state of the chip 9 along a route L3. In detail, the first temperature T1 is measured by the first thermal sensor 110 so that the first thermal sensor 110 generates the first input signal In1 (e.g. the first input signal In1 is 1). The inverter 130 reverses the first input signal In1 (e.g. the first input signal In1 is 1) so as to output the third input signal In3 (e.g. the third input signal In3 is 0). At this time, the second temperature T2 is not measured by the second thermal sensor 120 so that the second thermal sensor 120 generates the second input signal In2 (e.g. the second input signal In2 is 0). When the second input signal In2 is 0 and the third input signal In3 is 0, the latch circuit 140 is configured to output the output signal O1 which is 0. Therefore, the control circuit 20 does not control the chip 9 to change state. In other words, the state of the chip 9 is latched.

In some embodiments, please refer FIG. 1 to FIG. 3 together, when the measured temperature of the chip 9 is less than the first temperature T1, the latch circuit 140 outputs the output signal so as to change the second state of the chip 9 to the first state of the chip 9 along a route L4.

In detail, the first temperature T1 is not measured by the first thermal sensor 110 so that the first thermal sensor 110 generates the first input signal In1 (e.g. the first input signal In1 is 0). The inverter 130 reverses the first input signal In1 (e.g. the first input signal In1 is 0) so as to output the third input signal In3 (e.g. the third input signal In3 is 1). At this time, the second temperature T2 is not measured by the second thermal sensor 120 so that the second thermal sensor 120 generates the second input signal In2 (e.g. the second input signal In2 is 0). When the second input signal In2 is 0 and the third input signal In3 is 1, the latch circuit 140 is configured to output the output signal O1 which is 0. Therefore, the control circuit 20 controls the chip 9 to change state.

In summary, a truth table of the temperature delay device 10 is listed as below:

TABLE 1

| Temperature (° C.) | first input signal In1 | second input signal In2 | third input signal In3 | output signal O1 |
|---|---|---|---|---|
| T < T1 (stage I1) | 0 | 0 | 1 | 0 |
| T1 < T < T2 (stage I2) | 1 | 0 | 0 | 0 (latch) |
| T2 < T (stage I3) | 1 | 1 | 0 | 1 |
| T1 < T < T2 (stage I4) | 1 | 0 | 0 | 1 (latch) |
| T < T1 (stage I5) | 0 | 0 | 1 | 0 |

In the table 1, T is the measured temperature mentioned in the aforementioned embodiments.

Figure 4:
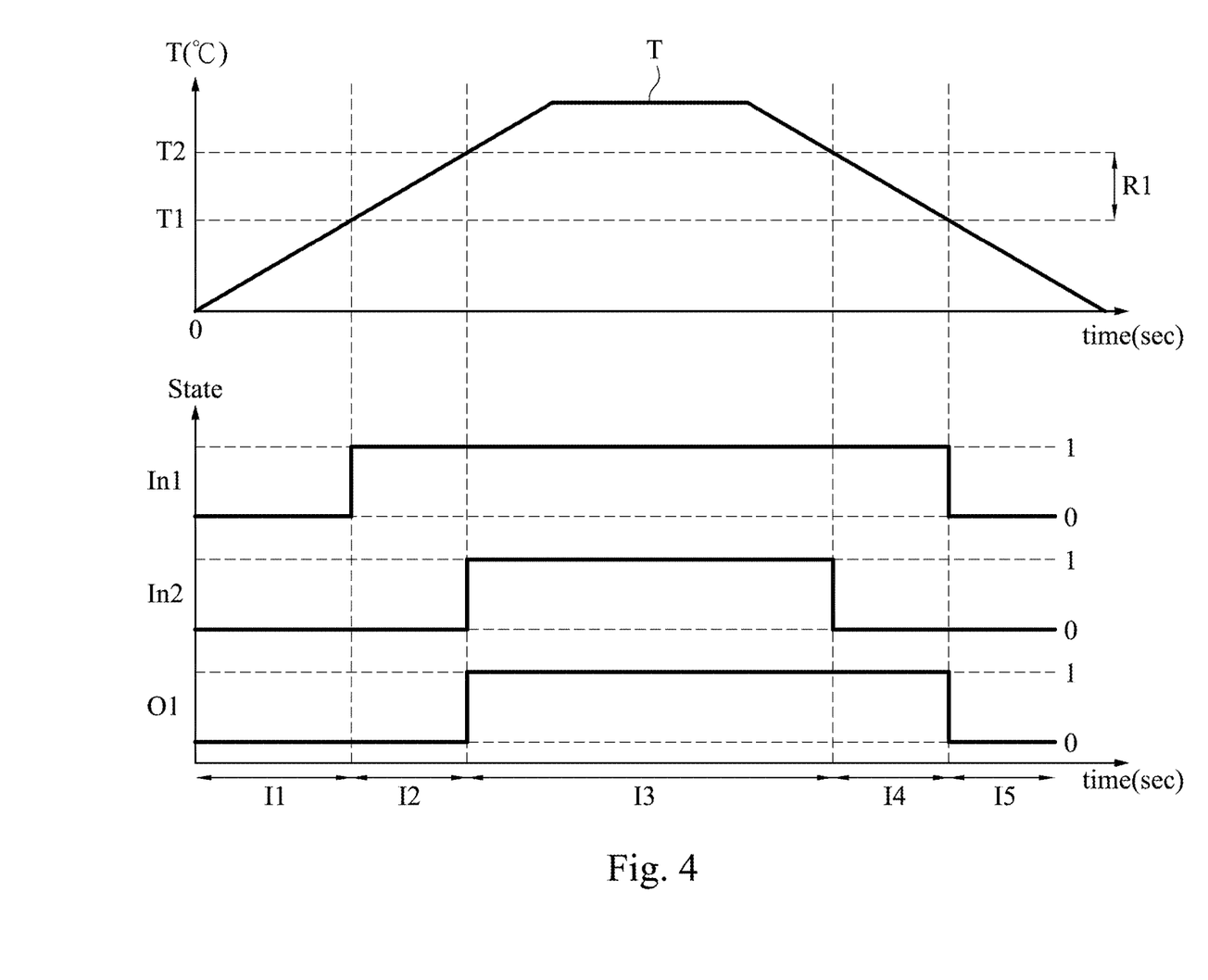
FIG. 4 depicts a coordinate graph of a relationship between a signal of a temperature delay device and a measured temperature of a chip according to one embodiment of the present disclosure.

FIG. 4 depicts a coordinate graph of a relationship between a signal of a temperature delay device and a measured temperature of a chip according to one embodiment of the present disclosure. In some embodiments, in order to facilitate the understanding of a temperature delay device of the present disclosure, please refer FIG. 1 to FIG. 4 together, embodiments in FIG. 4 are another way of expressing embodiments in FIG. 3. An upper half of FIG. 4 is a temperature graph of the chip which is in a state of normal heating and cooling, and a lower half of FIG. 4 is a timing diagram of signals of the temperature delay device. It is noted that the measured temperature T of the chip is a complex and drastic change in practice. Furthermore, it should be noted that the state of the chip is not changed in a stage 12 and in a stage 14. Since the detail operations of the temperature delay device 10 have been mentioned in the above graph, and repetitious details are omitted herein.

Figure 5:
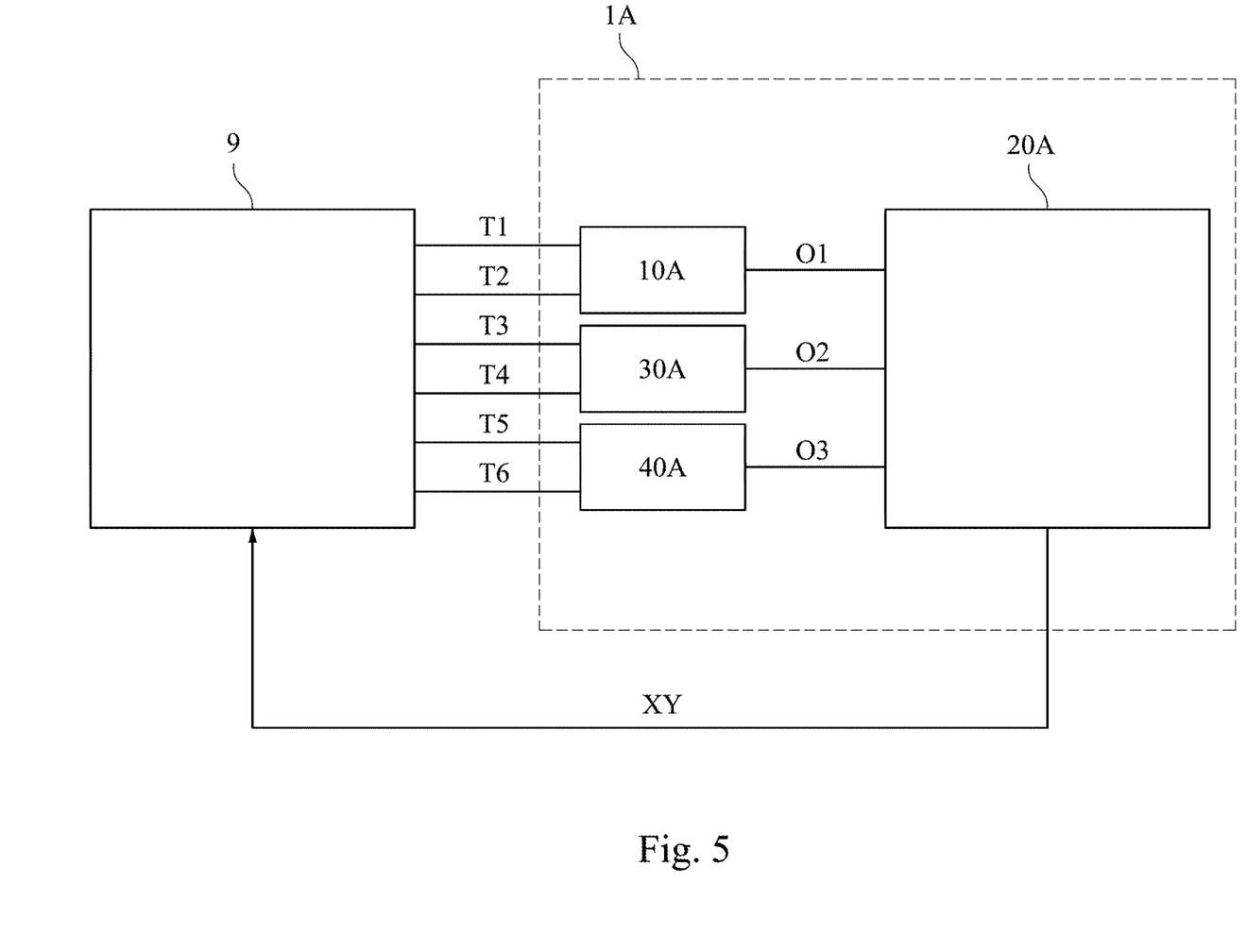
FIG. 5 depicts a schematic diagram of a temperature control system according to one embodiment of the present disclosure.

FIG. 5 depicts a schematic diagram of a temperature control system 1A according to one embodiment of the present disclosure. Compared with embodiments in FIG. 1, embodiments in FIG. 5 change a number of temperature delay device. The temperature control system 1A includes three temperature delay devices (e.g. a first temperature delay device 10A, a second temperature delay device 30A, and a third temperature delay device 40A) and a control circuit 20A. Each of the three temperature delay devices is the same as the embodiments in FIG. 1 and the embodiments in FIG. 2. The control circuit 20A is different from the control circuit 20 shown in FIG. 1. In some embodiments, the control circuit 20A includes a feedback circuit.

Figure 6:
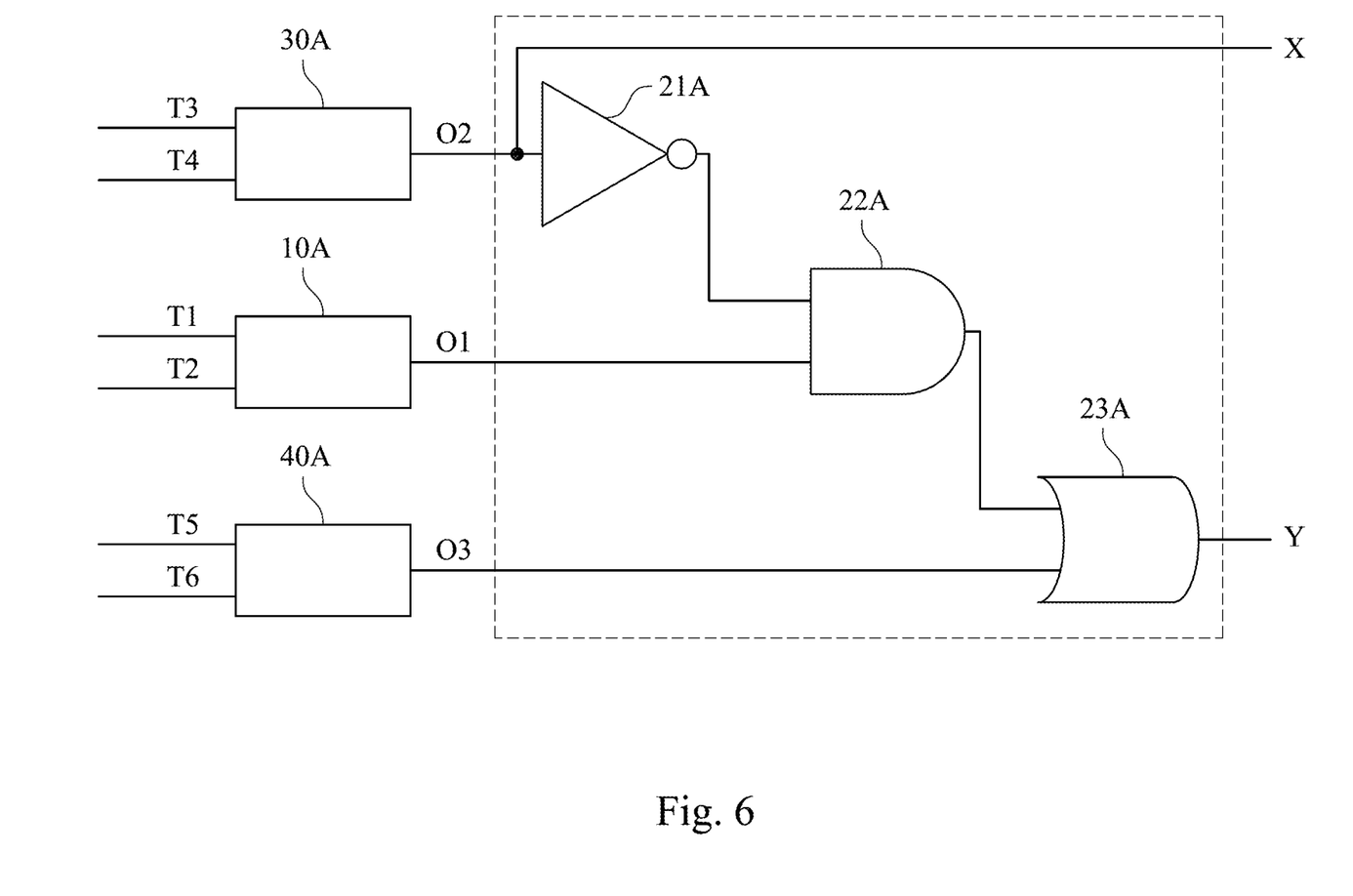
FIG. 6 depicts a schematic diagram of parts of a temperature control system according to one embodiment of the present disclosure.

FIG. 6 depicts a schematic diagram of parts of a temperature control system according to one embodiment of the present disclosure.

In some embodiments, please refer to FIG. 5 and FIG. 6, the first temperature delay device 10A is configured to measure a first temperature T1 and a second temperature T2 of the chip 9 so as to output a first input signal O1. The second temperature delay device 30A is configured to measure a third temperature T3 and a fourth temperature T4 of the chip 9 so as to output a second input signal O2. The third temperature delay device 40A is configured to measure a fifth temperature T5 and a sixth temperature T6 of the chip 9 so as to output a third input signal O3. The control circuit 20A is coupled to the first temperature delay device 10A, the second temperature delay device 30A, and the third temperature delay device 40A. The control circuit 20A is configured to receive the first input signal O1, the second input signal O2, and the third input signal O3 so as to output two signals X and Y. Each of the first temperature T1, the second temperature T2, the third temperature T3, the fourth temperature T4, the fifth temperature T5, and the sixth temperature T6 is different. Each of the first temperature T1, the second temperature T2, the third temperature T3, the fourth temperature T4, the fifth temperature T5, and the sixth temperature T6 is a fixed temperature in order to classify an actual temperature of the chip 9.

In some embodiments, please refer to FIG. 2 and FIG. 6, each of the first temperature delay device 10A, the second temperature delay device 30A, and the third temperature delay device 40A includes two thermal sensors, an inverter, and a latch circuit shown in FIG. 2.

In some embodiments, the control circuit 20A includes a first input end, a second input end, a third input end, a first output end, and a second output end. The first temperature delay device 10A, the second temperature delay device 30A, and the third temperature delay device 40A are coupled to the first input end, the second input end, and the third input end respectively.

In some embodiments, the control circuit 20A includes a first logic gate 21A, a second logic gate 22A, and a third logic gate 23A. The first logic gate 21A is coupled to the second temperature delay device 30A, the first input end, and the first output end. In some embodiments, the first logic gate 21A includes a NOT gate. The second logic gate 22A is coupled to the first temperature delay device 10A, the second input end, and the first logic gate 21A. In some embodiments, the second logic gate 22A includes an AND gate. The third logic gate 23A is coupled to the second logic gate 22A, the third temperature delay device 40A, the third input end, and the second output end. In some embodiments, the third logic gate 23A includes an OR gate.

Figure 7:
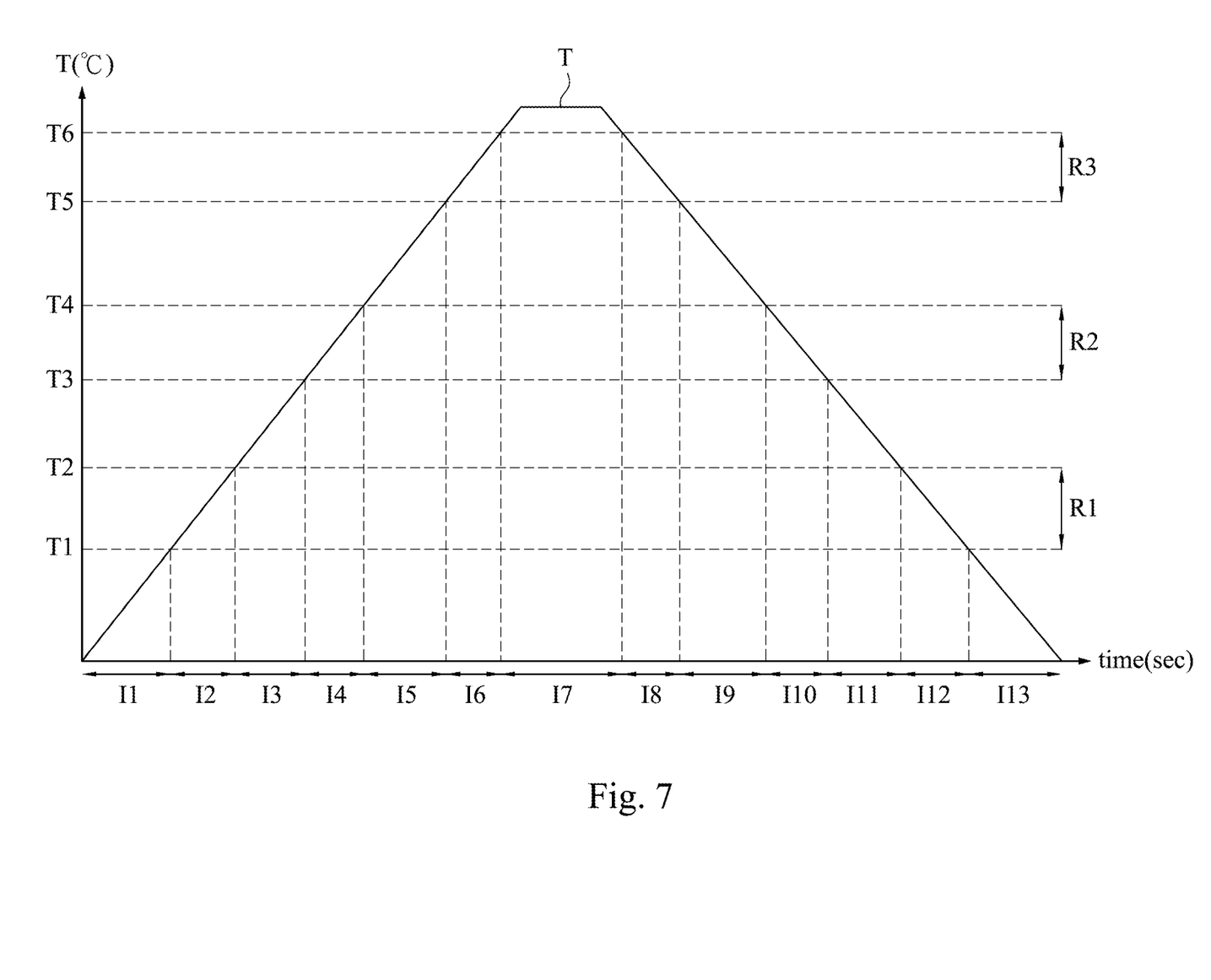
FIG. 7 depicts a coordinate graph of a measured temperature of a chip according to one embodiment of the present disclosure.

FIG. 7 depicts a coordinate graph of a measured temperature of a chip according to one embodiment of the present disclosure. In some embodiments, compared with embodiments in FIG. 4, a difference between FIG. 4 and FIG. 7 is that a number of temperatures is changed.

In some embodiments, the first temperature T1 and the second temperature T2 form a first temperature delay range R1. The third temperature T3 and the fourth temperature T4 form a second temperature delay range R2. The fifth temperature T5 and the sixth temperature T6 form a third temperature delay range R3. The first temperature delay range R1, the second temperature delay range R2, and the third temperature delay range R3 do not overlap with each other.

Figure 8:
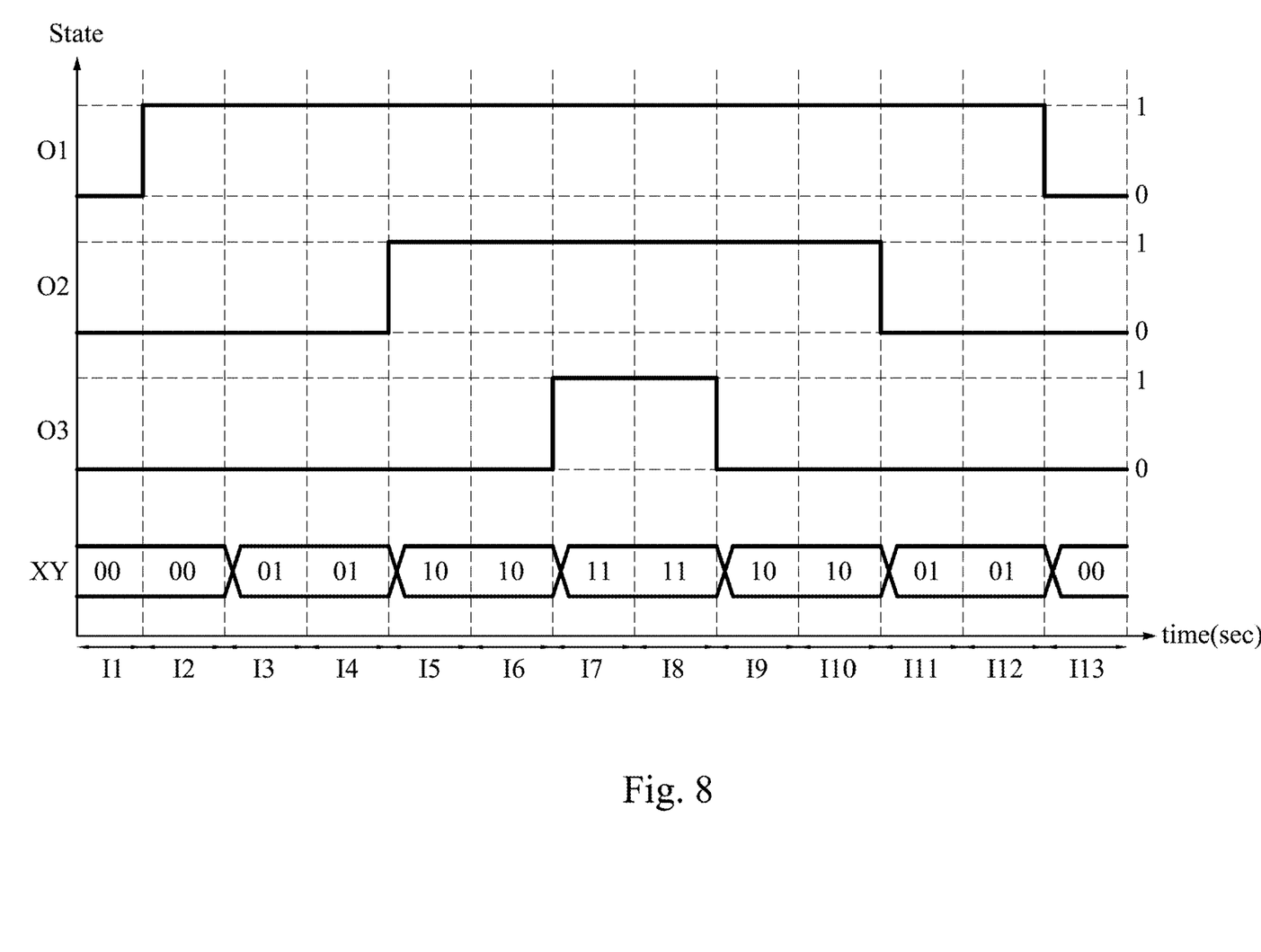
FIG. 8 depicts a coordinate graph of signals of a temperature control system according to one embodiment of the present disclosure.

FIG. 8 depicts a coordinate graph of signals of a temperature control system according to one embodiment of the present disclosure. In some embodiment, compared with embodiments in FIG. 4, a difference between FIG. 4 and FIG. 8 is that a number of signals is changed. Since operations of each of the first temperature delay device 10A, the second temperature delay device 30A, and the third temperature delay device 40A are the same as the first temperature delay device 10 shown in FIG. 2, and repetitious details are omitted herein.

In summary, a truth table of the temperature control system 1A is listed as below:

TABLE 2

| Temperature (° C.) | first input signal O1 | second input signal O2 | third input signal O3 | output signal X | output signal Y |
|---|---|---|---|---|---|
| T < T1 (stage I1) | 0 | 0 | 0 | 0 | 0 |
| T1 < T < T2 (stage I2) | 1 | 0 | 0 | 0 | 0 |
| T2 < T < T3 (stage I3) | 1 | 0 | 0 | 0 | 1 |
| T3 < T < T4 (stage I4) | 1 | 0 | 0 | 0 | 1 |
| T4 < T < T5 | 1 | 1 | 0 | 1 | 0 |

TABLE 2-continued

| Temperature (° C.) | first input signal O1 | second input signal O2 | third input signal O3 | output signal X | output signal Y |
|---|---|---|---|---|---|
| (stage I5) | | | | | |
| T5 < T < T6 (stage I6) | 1 | 1 | 0 | 1 | 0 |
| T6 < T (stage I7) | 1 | 1 | 1 | 1 | 1 |
| T5 < T < T6 (stage I8) | 1 | 1 | 1 | 1 | 1 |
| T4 < T < T5 (stage I9) | 1 | 1 | 0 | 1 | 0 |
| T3 < T < T4 (stage I10) | 1 | 1 | 0 | 1 | 0 |
| T2 < T < T3 (stage I11) | 1 | 0 | 0 | 0 | 1 |
| T1 < T < T2 (stage I12) | 1 | 0 | 0 | 0 | 1 |
| T < T1 (stage I13) | 0 | 0 | 0 | 0 | 0 |

In the table 2, T is the measured temperature mentioned in the aforementioned embodiments.

In some embodiment, a Boolean algebra of the temperature control system 1A is listed as below according to the Table 2 and FIG. 6:

$$X = O2, Y = \overline{O2} \cdot O1 + O3 \quad \text{formula 1}$$

Based on the above embodiments, the present disclosure provides a temperature delay device and a temperature control system so as to construct a temperature delay range R1 so that the chip will not shut down due to drastic temperature changes.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A temperature delay device, comprising:
   a first thermal sensor, configured to measure a first temperature of a chip to output a first input signal;
   a second thermal sensor, configured to measure a second temperature of the chip to output a second input signal;
   an inverter, coupled to the first thermal sensor, and configured to reverse the first input signal so as to output a third input signal; and
   a latch circuit, coupled to the inverter and the second thermal sensor, and configured to output an output signal according to the second input signal and the third input signal, wherein the first temperature is different from the second temperature.

2. The temperature delay device of claim 1, wherein when a measured temperature of the chip is higher than the first temperature but less than the second temperature, the latch circuit locks a first state of the chip.

3. The temperature delay device of claim 2, wherein when the measured temperature of the chip is higher than the second temperature, the latch circuit outputs the output signal so as to change the first state of the chip to a second state of the chip.

4. The temperature delay device of claim 3, wherein when the measured temperature of the chip is less than the second temperature but higher than the first temperature, the latch circuit locks the second state of the chip.

5. The temperature delay device of claim 4, wherein when the measured temperature of the chip is less than the first temperature, the latch circuit outputs the output signal so as to change the second state of the chip to the first state of the chip.

6. The temperature delay device of claim 1, wherein the latch circuit comprises a set end and a reset end, wherein the set end of the latch circuit is coupled to the inverter, wherein the reset end of the latch circuit is coupled to the second thermal sensor.

7. The temperature delay device of claim 6, wherein the latch circuit comprises two logic gates, wherein one of the two logic gate is coupled to the set end, wherein another one of the two logic gate is coupled to the reset end.

8. The temperature delay device of claim 7, wherein each of the two logic gates comprises one of NOR gate and NAND gate.

9. A temperature control system, comprising:
   a first temperature delay device, configured to measure a first temperature and a second temperature of a chip so as to output a first input signal;
   a second temperature delay device, configured to measure a third temperature and a fourth temperature of the chip so as to output a second input signal;
   a third temperature delay device, configured to measure a fifth temperature and a sixth temperature of the chip so as to output a third input signal; and
   a control circuit, coupled to the first temperature delay device, the second temperature delay device, and the third temperature delay device, wherein the control circuit is configured to receive the first input signal, the second input signal, and the third input signal so as to output two signals, wherein each of the first temperature, the second temperature, the third temperature, the fourth temperature, the fifth temperature, and the sixth temperature is different.

10. The temperature control system of claim 9, wherein the first temperature and the second temperature form a first temperature delay range, wherein the third temperature and the fourth temperature form a second temperature delay range, wherein the fifth temperature and the sixth temperature form a third temperature delay range, wherein the first temperature delay range, the second temperature delay range, and the third temperature delay range do not overlap with each other.

11. The temperature control system of claim 9, wherein each of the first temperature delay device, the second temperature delay device, and the third temperature delay device comprises two thermal sensors, an inverter, and a latch circuit.

12. The temperature control system of claim 9, wherein the control circuit comprises a first input end, a second input end, a third input end, a first output end, and a second output end, wherein the first temperature delay device, the second temperature delay device, and the third temperature delay device are coupled to the first input end, the second input end, and the third input end respectively.

13. The temperature control system of claim 12, wherein the control circuit comprises a first logic gate, wherein the first logic gate is coupled to the second temperature delay device, the first input end, and the first output end, wherein the first logic gate comprises a NOT gate.

14. The temperature control system of claim 13, wherein the control circuit comprises a second logic gate, wherein the second logic gate is coupled to the first temperature delay device, the second input end, and the first logic gate, wherein the second logic gate comprises an AND gate.

15. The temperature control system of claim 14, wherein the control circuit comprises a third logic gate, wherein the third logic gate is coupled to the second logic gate, the third temperature delay device, the third input end, and the second output end, wherein the third logic gate comprises an OR gate.

\* \* \* \* \*